(12) United States Patent
Mambakkam et al.

(10) Patent No.: US 7,526,675 B2
(45) Date of Patent: *Apr. 28, 2009

(54) SOFTWARE RECOVERY METHOD FOR FLASH MEDIA WITH DEFECTIVE FORMATTING

(75) Inventors: Sreenath Mambakkam, San Jose, CA (US); Shanmugavelu Thiagaraian, San Jose, CA (US); Jothikumar Govindaraju, Menlo Park, CA (US)

(73) Assignee: MCM Portfolio LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/473,823

(22) Filed: Jun. 23, 2006

(65) Prior Publication Data

US 2006/0242460 A1 Oct. 26, 2006

Related U.S. Application Data

(63) Continuation of application No. 10/064,967, filed on Sep. 4, 2002, now Pat. No. 7,093,161.

(60) Provisional application No. 60/319,478, filed on Aug. 16, 2002.

(51) Int. Cl.
*G06F 11/00* (2006.01)

(52) U.S. Cl. .......................................... 714/15; 714/5

(58) Field of Classification Search ................ 714/2, 714/5, 15
See application file for complete search history.

(56) References Cited

U.S. PATENT DOCUMENTS

| 5,437,020 | A | 7/1995 | Wells et al. |
|---|---|---|---|
| 5,734,894 | A | 3/1998 | Adamson et al. |
| 5,790,878 | A | 8/1998 | Anderson et al. |
| 5,964,885 | A | 10/1999 | Little et al. |
| 6,839,864 | B2 * | 1/2005 | Mambakkam et al. .......... 714/5 |
| 7,019,778 | B1 * | 3/2006 | Prabhu et al. .......... 348/333.01 |
| 7,093,161 | B1 | 8/2006 | Mambakkam et al. |
| 7,206,970 | B1 * | 4/2007 | Lauterbach et al. ........... 714/36 |
| 7,231,643 | B1 | 6/2007 | Galbo |
| 2002/0078458 | A1 * | 6/2002 | Furon et al. .................... 725/75 |
| 2003/0070112 | A1 | 4/2003 | York |
| 2004/0044864 | A1 * | 3/2004 | Cavallo ...................... 711/162 |
| 2007/0180291 | A1 | 8/2007 | Galbo |

OTHER PUBLICATIONS

Galbraith, Rob; "Building the Ultimate Photo Recovery Kit;" Jan. 23, 2002; http://www.robgalbraith.com/bins/content_page.asp?cid=7-4419-4501.

(Continued)

*Primary Examiner*—Joshua A Lohn
(74) *Attorney, Agent, or Firm*—Greenberg Traurig, LLP

(57) ABSTRACT

A method and software program for recovering data from corrupted flash media. In one aspect, the method employs a low-level access scheme that enables data to be recovered when high-level interfaces, such as file systems, are damaged. The type of flash media is determined, and a corresponding access scheme is employed. Depending on the type of damage to the media, a physical-to-logical table may be built and employed to sequentially access the flash media in search of indicia from which selectable file-types can be identified, or the media may be accessed using normal operating system commands. Once the file indicia are found, the location of corresponding file data is identified, whereupon the file data are read and stored. The software program employs an application program interface (API) comprising one or more sets of pass-through commands to enable low-level access to the flash media and to build the physical-to-logical table.

39 Claims, 10 Drawing Sheets

OTHER PUBLICATIONS

DataRescue Home Page; archived Jul. 22, 2001; http://web.archive.org/web/20010722191109/http://datarescue.com.

DataRescue PhotoRescue™ Specifications; archived Aug. 27, 2001; http://web.archive.org/web/20010827073251/www.datarescue.com/photorescue.spec.htm.

PhotoRescue User's Guide; rev 1.0; 2001.

EasyRecovery™ Professional Edition User Guide; Ontrack; Copyright 2000.

U.S. Appl. No. 60/359,510, filed Feb. 22, 2002, Neal Anthony Galbo.

* cited by examiner

SOFTWARE RECOVERY METHOD FOR FLASH MEDIA WITH DEFECTIVE FORMATTING

CROSS-REFERENCES TO RELATED APPLICATIONS

Under 35 U.S.C. §120, this application is a continuation application of application Ser. No. 10/064,967, filed on Sep. 4, 2002 now U.S. Pat. No. 7,093,161, entitled "SOFTWARE RECOVERY METHOD FOR FLASH MEDIA WITH DEFECTIVE FORMATTING," now U.S. Pat. No. 7,093,161, which claims priority to the provisional application entitled "SOFTWARE RECOVERY METHOD FOR FLASH MEDIA WITH DEFECTIVE FORMATTING," application Ser. No. 60/319,478, filed on Aug. 16, 2002, the benefit of the filing date of which is claimed under 35 U.S.C. § 119(e).

BACKGROUND OF THE INVENTION

1. Field of Invention

The field of invention relates generally to flash media and, more specifically but not exclusively, relates to a method and software for recovering data from defectively-formatted flash media.

2. Background Information

Many kinds of flash-based media, such as COMPACT FLASH, SMARTMEDIA, MEMORY STICK, MultiMediaCard, Secure Digital Card, etc., are currently being used for various applications, such as digital cameras, MP3 players, PDAs etc. There is also a new picture format, XD(Xtended Digital) Picture Card, announced by a consortium of Japanese electronics manufacturers, including Toshiba, Fuji, and Olympus. Often flash media are inserted and removed from a host device, such as a PDA (Personal Digital Assistant), digital camera, MP3 player, etc., and inserted into a reader or other, similar device. It occasionally happens that a person may remove a media card while the system is reading to or writing from the card. Media card removal, particularly during the writing, but also sometimes during the reading, may destroy the card formatting, resulting, in most cases, in making the data unreadable by the interfacing device. Media card formatting and file information is sometimes corrupted or lost due to other causes, such as power failure during read or write operations, faulty programs, faulty host device or reader, high level "erasing" of files by a user, who later wants to recover such files, or other causes. As a result, the content on the card cannot be read and/or accessed. What is clearly needed is a software tool that allows analysis of such "destroyed" cards and a repair and restore utility to restore the card formatting and, to the maximum extent possible, the picture files, music files, or other files on the card.

SUMMARY OF INVENTION

In accordance with aspects of the present invention a method for recovering data from corrupted flash media is disclosed. In one aspect, the method employs a low-level access scheme that enables data to be recovered when higher-level interfaces, such as file systems, are damaged. The type of flash media is determined, and a corresponding access scheme is employed. Depending on the type of damage to the media, a physical-to-logical table may be built and employed to sequentially access the flash media in search of indicia from which selectable file-types can be identified, or the media may be accessed using normal operating system commands. Once the file indicia are found, the location of corresponding file data is identified, whereupon the file data are read and stored.

In another aspect of the present invention, the method is implemented via a software program. The software program provides a user interface to enable users to select file types to recover, and once recovered, the user is enabled to rename files if desired. The software program employs an application program interface (API) comprising one or more sets of pass-through commands to enable low-level access to the flash media and to build the physical-to-logical table.

BRIEF DESCRIPTION OF FIGURES

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

FIG. 5 is a continuation of the flowchart of FIG. 2 illustrating operations and logic performed when reading data corresponding to previously inaccessible files, such as picture files and the like.

DETAILED DESCRIPTION OF PREFERRED EMBODIMENTS

Embodiments of a method and apparatus for reading and repairing defectively-formatted flash media and the like are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Generally, media cards may be accessed by computers using so-called readers or via built-in circuitry designed for reading (usually) a particular type of flash media. Operational details of one such reader are disclosed in U.S. Pat. No. 6,438,638, issued Aug. 20, 2002, entitled, "FLASH-TOASTER FOR READING SEVERAL TYPES OF FLASH-MEMORY CARDS WITH OR WITHOUT A PC." Typically, the reader or built-in circuitry, in combination with an appropriate operating system driver, provide an interface to a flash media device such that the device appears to the operating system (and thus applications running on the operating system) as a disk storage device. Accordingly, the storage structure of flash media devices is configured in a manner that supports a general disk access scheme. In support of this scheme, flash media often employ disk-like file system access schemes.

Figure 1:
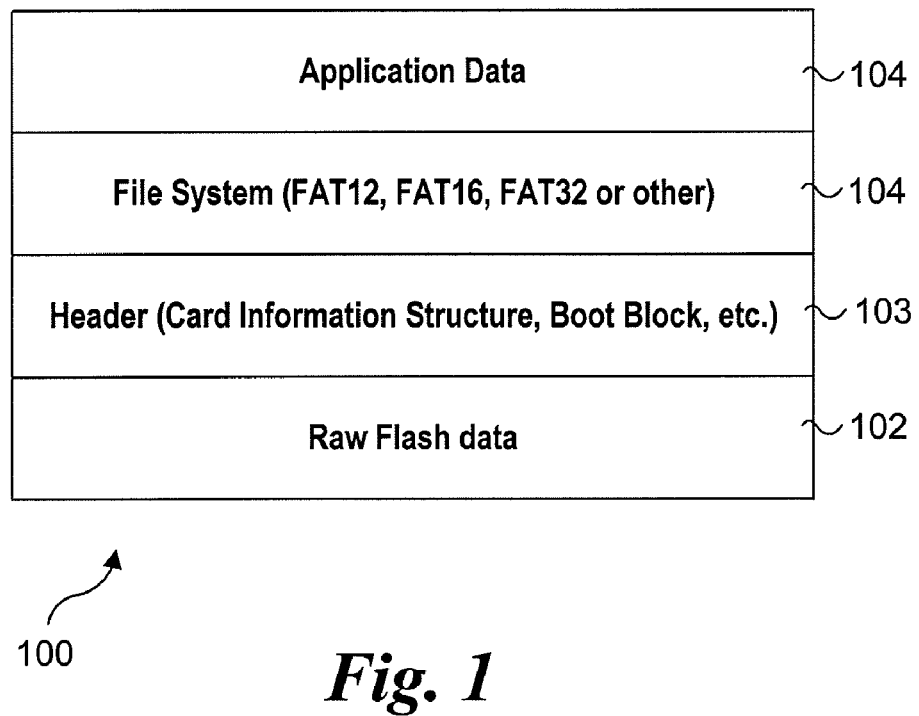
FIG. 1 is a block diagram illustrating a data stack corresponding to a typical flash media data access scheme.

FIG. 1 shows a typical organization of a data stack in a flash card. At the bottom of stack 100 is the actual raw flash data 102. The raw data may contain bad blocks, etc., which are usually dealt with on the file system level (i.e., FAT level) 104. The main file system types are FAT12, FAT16 and FAT32. All of these contain a master boot record (MBR) used in conjunction with a disk boot record (DBR) and file allocation table (FAT) to store computer-type. A flash header 103 generally contains information from which physical (i.e., raw data) to logical (i.e., file system level) mapping can be determined, such as Card Information Structure (CIS) information. Generally, the CIS contains information about the card manufacturer and many of the device characteristics, and is sometimes used to define manufacturer-specific features, such as whether data stored on the media correspond to digital pictures in a regular or panoramic format, etc., also referred to as proprietary sub-formatting information for different camera types; and MP3 players, mostly using proprietary information. Similarly, devices that use MEMORY STICK media put down a header 103 known as a boot block to signify that the media has a known signature on it.

The header 103 also lets the system know what type of file system is used in layer 104. The file system (FAT typically) contains information about which sectors form contiguous files, which sectors are bad and cannot be used, etc. In some cases they may also contain information about how often a sector has been used, to optimize rotation, but that type of information is not necessarily required, as the number of cycles performed by cameras is rather low when compared to typical PC applications.

On top of the FAT is the formatted data 105, which is the data that is typically presented to a user. This data is often in a format such as Joint Photographic Expert Group (JPEG or JPG) files, Bitmap Picture (BMP) files by Microsoft, Graphic Interchange File (GIF) files by CompuServe, Motion Picture Expert Group Protocol Layer 3 (MP3) files, Waveform Audio File Format (WAV) files, Audio-Video Interchange (AVI) files, Tagged Image File Format (TIFF or TIF) files, Motion Picture Expert Group (MPG or MPEG) files, QUICKTIME Movie (MOV) files by Apple using QUICKTIME format, and WINDOWS MEDIA Audio format (WMA) files.

Figure 2:
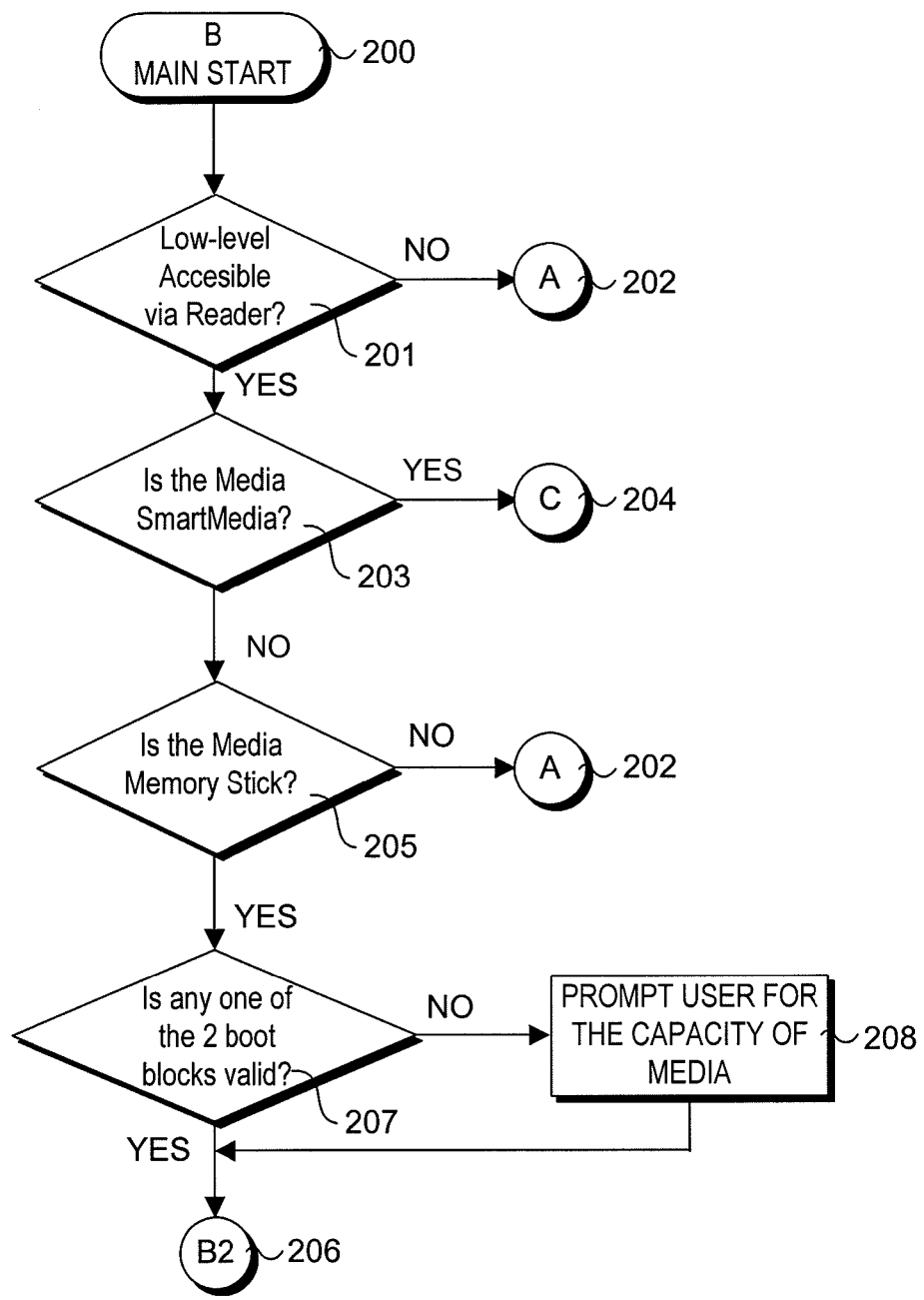
FIG. 2 is a flowchart showing high-level operations corresponding to a software program in accordance with an embodiment of the invention.

FIG. 2 shows a top-level flowchart illustrating operations performed by an embodiment of the novel software program described herein. The program initializes at a block 200, which corresponds to the main entry point in the program. In a decision block 201 a determination is made regarding whether direct low-level access to the media is available. For example, various readers manufactured by OnSpec, Electronic, Inc. of Cupertino, Calif., support low-level access to flash media. Further details of the operations of these readers are disclosed in U.S. Pat. No. 6,438,638, U.S. Pat. No. 6,832,281, U.S. Pat. No. 7,252,240, and U.S. patent application Ser. No. 10/002,567 (now abandoned), the specifications and drawings of which are incorporated herein by reference. Moreover, other readers that support low-level access to flash media may also be used. If low-level access is not available, the logic proceeds to a block 202, which initiates the operations described below with reference to FIG. 5. If low-level access is available, the logic proceeds to a block 203, wherein a determination is made regarding whether the flash media comprises SMARTMEDIA(tm). If it does, the logic proceeds to a block 204, which initiates the operations shown in FIG. 3a.

Figure 3A:
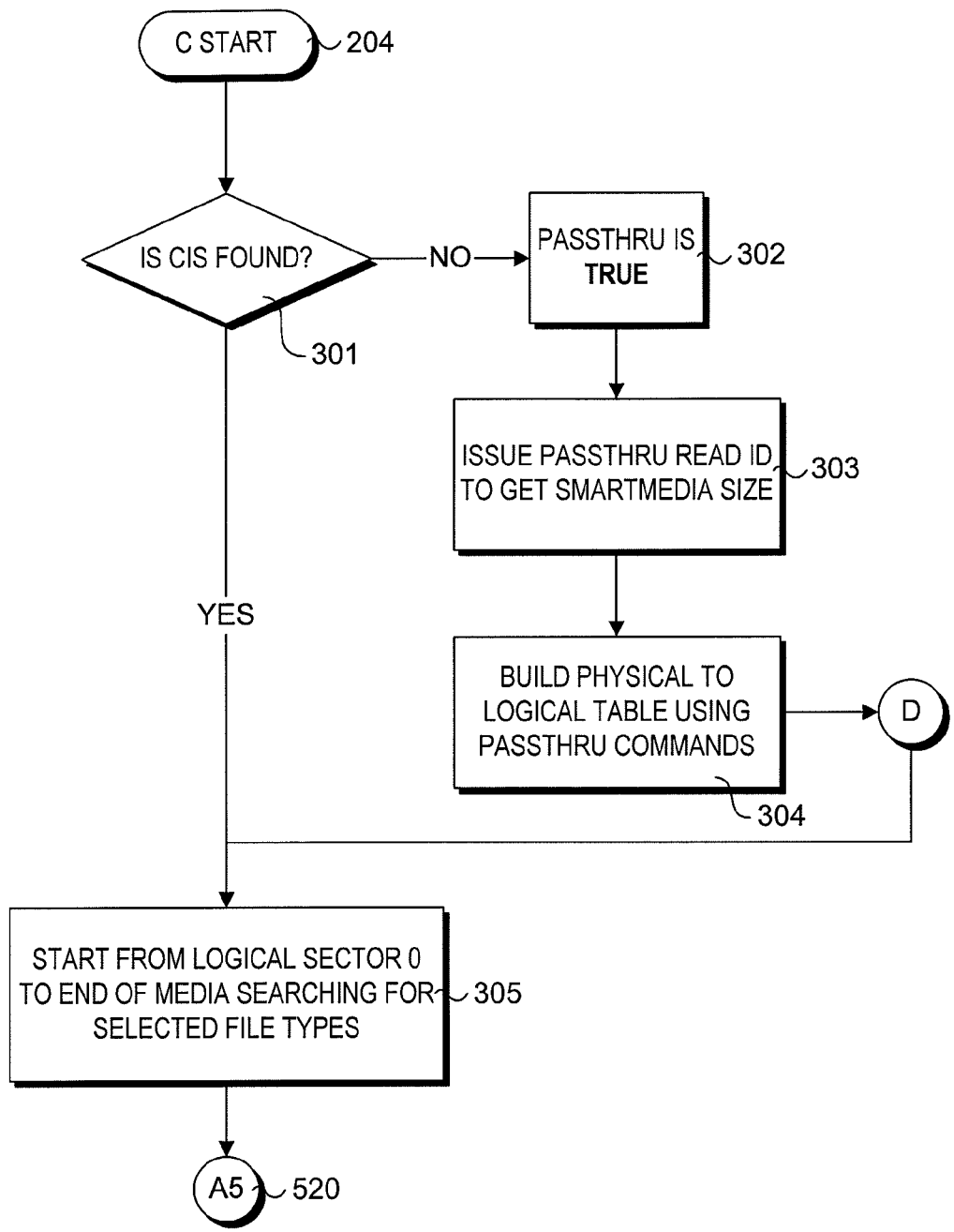
FIG. 3a is a continuation of the flowchart of FIG. 2 illustrating operations and logic pertaining to processing a SMARTMEDIA flash device.

In accordance with a decision block 301 in FIG. 3a, the program looks at the SMARTMEDIA flash header to determine if a CIS exists. Generally, the CIS will be stored in the first available physical block (e.g., physical block 0, if this block is not damaged). As described above, the CIS includes information that is used for defining characteristics of the media, including its physical access structure (i.e., block size, number of blocks, etc.). For SMARTMEDIA cards this (preferably) will correspond to the physical access structure defined in the SMARTMEDIA Physical Format Specification. If no CIS is present, the program builds a physical-to-Logical table through pass-through code, as described below with reference to FIG. 4. Pass-through code is a code that allows the application to see the layers 101 through 104 (as shown in FIG. 1) below the logical layer 105 that contains the file-formatted data. By looking at the data at the lowest levels, in particular at level 102, the software can determine what was there and rebuild the sectors. Upon not finding a CIS, a pass-through flag is marked as true in a block 302, and a pass-through Read ID command is issued to retrieve the SMARTMEDIA size. The physical to logical table is then built using pass-through commands in consideration of the SMARTMEDIA size, as described below. Exemplary portions of the pass-through code application program interface (API) are provided in the Appendix section of this disclosure.

After the CIS is found, or the physical-to-logical table is built, the program proceeds to a block 305, wherein, beginning with logical sector zero, as defined by the physical-to-logical table or identified by the CIS, the media is searched for the selected file types described above (e.g., JPEG, GIF, MPEG, etc). In one embodiment, the user may be prompted to indicate the file types present on the media, or there may be an automatic lookup in a table (not shown) using a database (not shown) to determine which file types are supported. Details of this operation are continued at an entry point 520 in FIG. 5.

Returning to FIG. 2, if the flash media does not comprise SMARTMEDIA, a determination is made in a decision block 205 regarding whether the media comprises a MEMORY STICK (or MEMORY STICK compatible media). If the answer is No, the program proceeds to block 202, which begins the operations discussed in the description below of FIG. 5. If the program detects that the media is a MEMORY STICK, the program tests in a decision block 207 to determine whether there is a valid boot block. It is to be noted that MEMORY STICK contains two boot blocks and if neither one is recognized, the user is prompted in a block 208 to give the capacity of the media and then the program returns to the main flow, so that in either case (No or Yes), the program proceeds to a block 206, and the operation continues as shown in FIG. 3*b*.

Figure 3B:
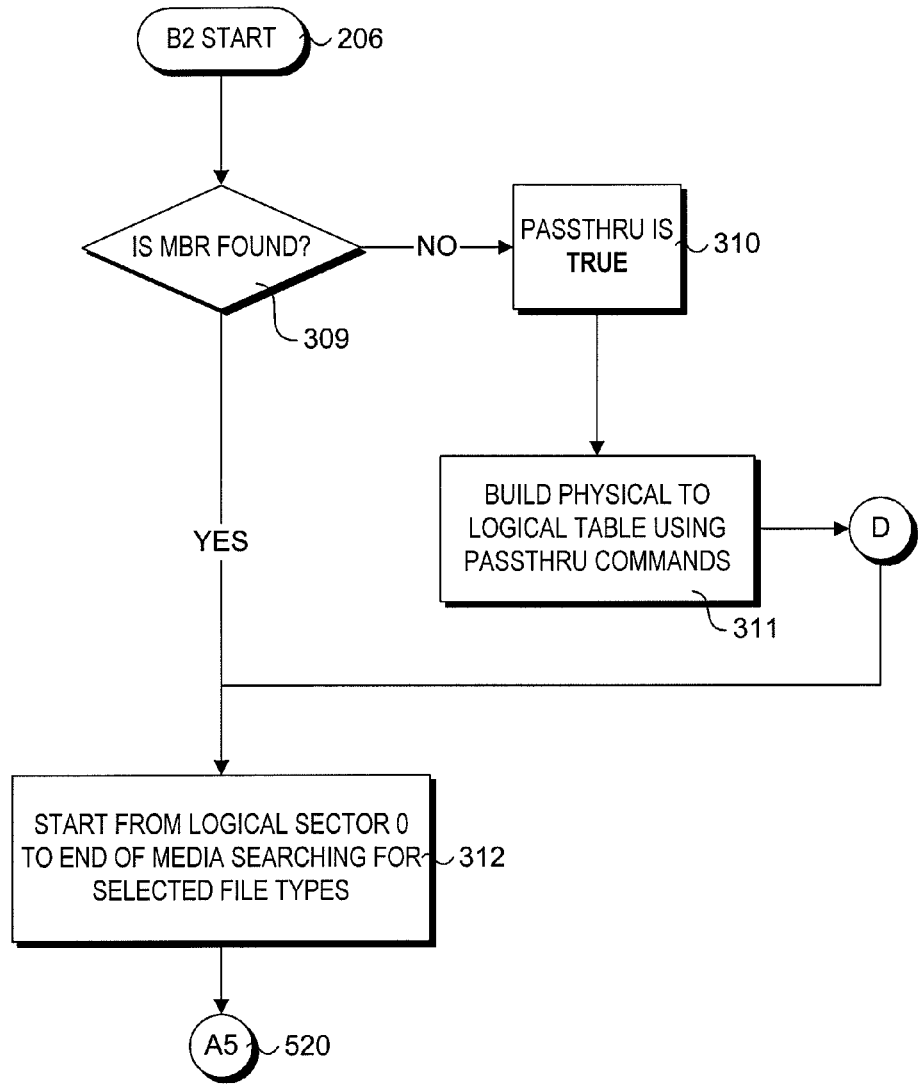
FIG. 3b is a continuation of the flowchart of FIG. 2 illustrating operations and logic pertaining to processing various types of flash media that don't include SMARTMEDIA and MEMORY STICK devices.

Referring now to FIG. 3*b*, in a decision block 309, the program searches for a master boot record (MBR). If an MBR is not found, the pass-through flag is marked as TRUE in a block 310, and a physical-to-logical table is built using MEMORY STICK pass-through commands in accordance with a block 311 and the operations of FIG. 4 described below. After finding the MBR or building the physical-to-logical table, the program proceeds to a block 512, in which the program again starts from Logical Sector 0 (identified via either the MBR or the physical-to-logical table) and searches for the selected file types using a process similar to that performed in block 305 of FIG. 3*a* above. Details of this operation are continued at an entry point 520 in FIG. 5.

Building the Physical-to-Logical Table

In general, a flash media device has a physical storage scheme corresponding to the lowest access level of the device. This is very inconvenient for software applications and the like to use, since various flash media have different physical storage schemes. In order to provide a standard access interface, a file system interface (i.e., layer 104) is provided. The file system handles the details of converting file access requests from an application (via an operating system call and using a corresponding OS driver) to a low-level request that is actually used to access the data. This is usually supported by a physical-to-logical mapping scheme, whereby the file system presents a logical representation of the storage device to the application. The file system layer also enables the file system to be standardized (e.g., FAT12, FAT16, FAT32, etc.), enabling access to the flash media using a well-known interface.

At its lowest level, flash media provide a physical storage scheme based on addressable units called blocks. A block-addressing scheme (vs. a pure linear addressing scheme) is used, in part, because individual bits on flash media devices are not re-writable. Accordingly, in order to rewrite data, one or more entire blocks must first be erased (i.e., reset), and then new data may be written to the block(s) by setting selected bits. For convenience, the physical addressing scheme may employ a page-based memory access scheme, wherein each block is further divided into one or more memory pages. This enables the device to support a page-by-page reading and (for blocks that have been reset) writing scheme, and a block-by-block erasing scheme. For example, an 8 megabyte SMART-MEDIA device has 1024 blocks, each comprising 16 pages of memory, wherein each memory page comprises 512 bytes plus 16 "extra" bytes, and wherein individual bytes may be accessed via a page address and an offset address.

As described above, the logical storage scheme for flash media is generally set up to mimic a disk storage device (i.e., hard drive), wherein the most basic storage unit comprises a sector which may map to one or more physical storage pages based on physical-to-ogical mapping. The 16 extra bytes above are termed "extra" because in a corresponding disk device, each memory page will correspond to a 512 byte sector, and the sectors are contiguous without any extra data in between. In general, various types of schemes may be used to store the physical-to-logical mapping data, including redundant schemes. In SMARTMEDIA and MEMORY STICK devices, logical block addressing information is stored in these "extra" bytes.

Figure 4:
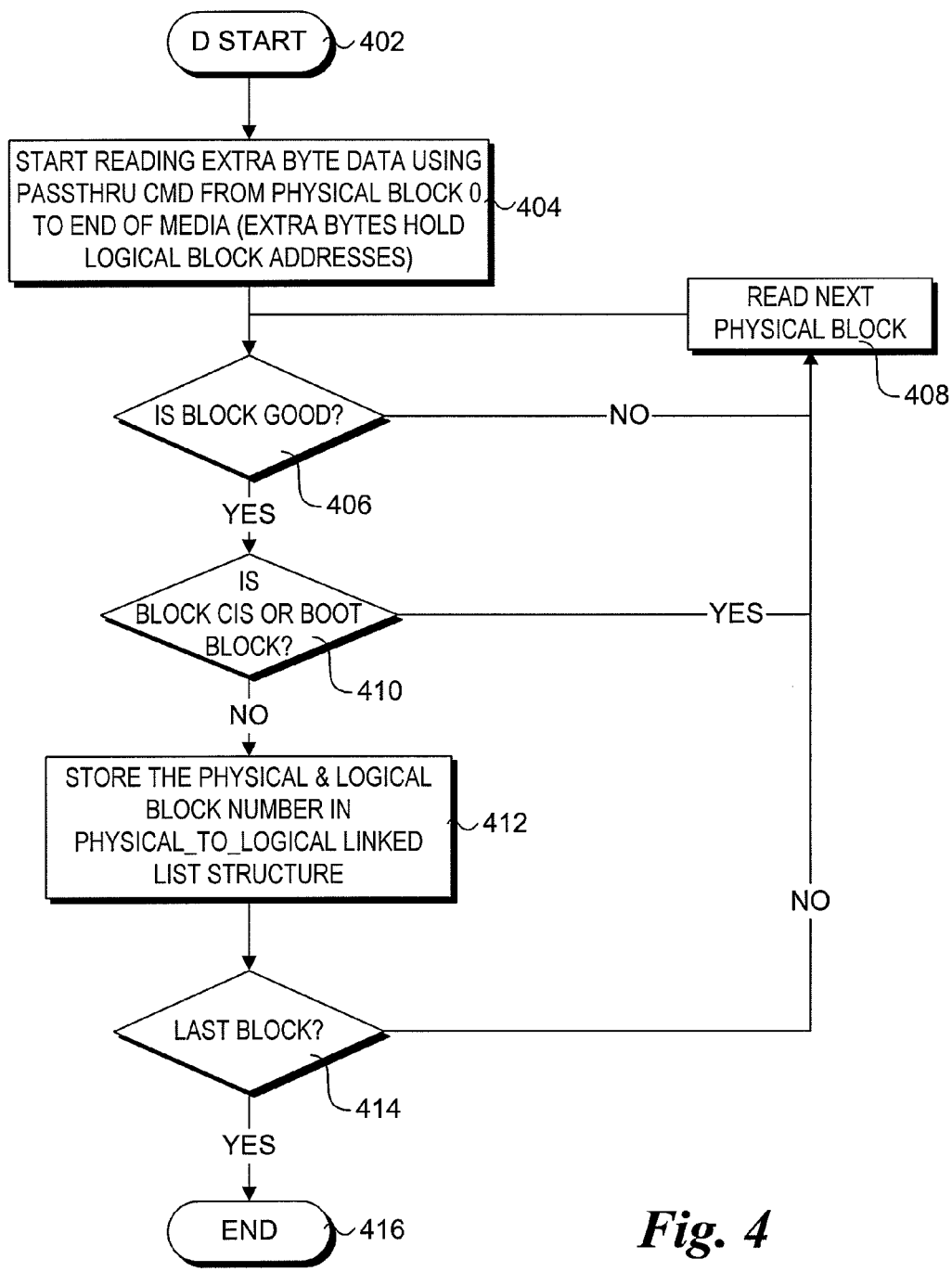
FIG. 4 is a continuation of the flowchart of FIG. 2 illustrating operations and logic performed when building a physical to logical table that maps physical storage locations to logical storage locations.

In view of the foregoing considerations, details for building the physical-to-logical table are shown in the portion of the flowchart illustrated in FIG. 4. As depicted by a block 404, retrieval of the physical-to-logical mapping information begins by reading corresponding data in the extra byte portions of the blocks using appropriate pass-through commands, beginning with physical block 0 and continuing to the end of the media. For each block, the following operations corresponding to blocks 406, 408, 410, 412, and 414 are performed, as appropriate.

First, in decision block 406, a determination is made regarding whether the block is good. Such information can generally be obtained directly from the device using known methods. If the block is not good, the logic proceeds to a block 408, which loops the logic back to begin processing the next block. If the block is good, the logic proceeds to a decision block 410 in which a determination is made regarding whether the block is a CIS block (e.g., for SMARTMEDIA) or a boot block (e.g., for MEMORY STICK). If the answer is Yes, the logic loops back via block 408 to begin processing the next block. If the block is not a CIS or boot block, data identifying the logical block number is extracted from the extra byte data for the block and corresponding physical-to-logical block mapping information is stored in a PHYSICAL_TO_LOGICAL linked list structure, wherein each entry maps a physical block to its corresponding logical block. In accordance with decision block 414 and block 408, the operations of blocks 406, 410, 412, are repeated until all of the blocks have been processed in a similar manner to complete building of the PHYSICAL_TO_LOGICAL linked list structure. This linked list structure comprises the physical-to-logical table.

Extracting File Data

Generally, the operations described with reference to the portion of the flowchart shown in FIG. 5 pertain to the extraction of file data from a corrupted flash media device, which may be accessed via block 202 from FIG. 2 or block 520 from FIGS. 3*a* and 3*b*. As discussed above, block 202 is encountered if either low-level access support is available, or if the flash media is neither a SMARTMEDIA component nor a MEMORY STICK. If such is the case, the first operation that is performed is to read Sector 0, in accordance with a block 501. Next, in a decision block 502 a determination is made regarding whether the MBR is valid. If the MBR is valid, the disk boot record (DBR) is read in a block 503 and tested for validity in a block 504. If the DBR is valid, the starting sector is determined in block 505 to be from the Data Area. If the DBR is not valid, the starting sector to read is determined to be Logical Sector 0, as depicted by a block 512.

In case no valid MBR is detected in block 502, the program branches to a block 510 to see if there is a valid DBR. If there is a valid DBR, it branches back to block 505. If there is no valid DBR, the program proceeds to a block 511, where the starting sector to read is determined to be Physical Sector 0, and from block 511, the program then branches back to block 521.

Figure 5:
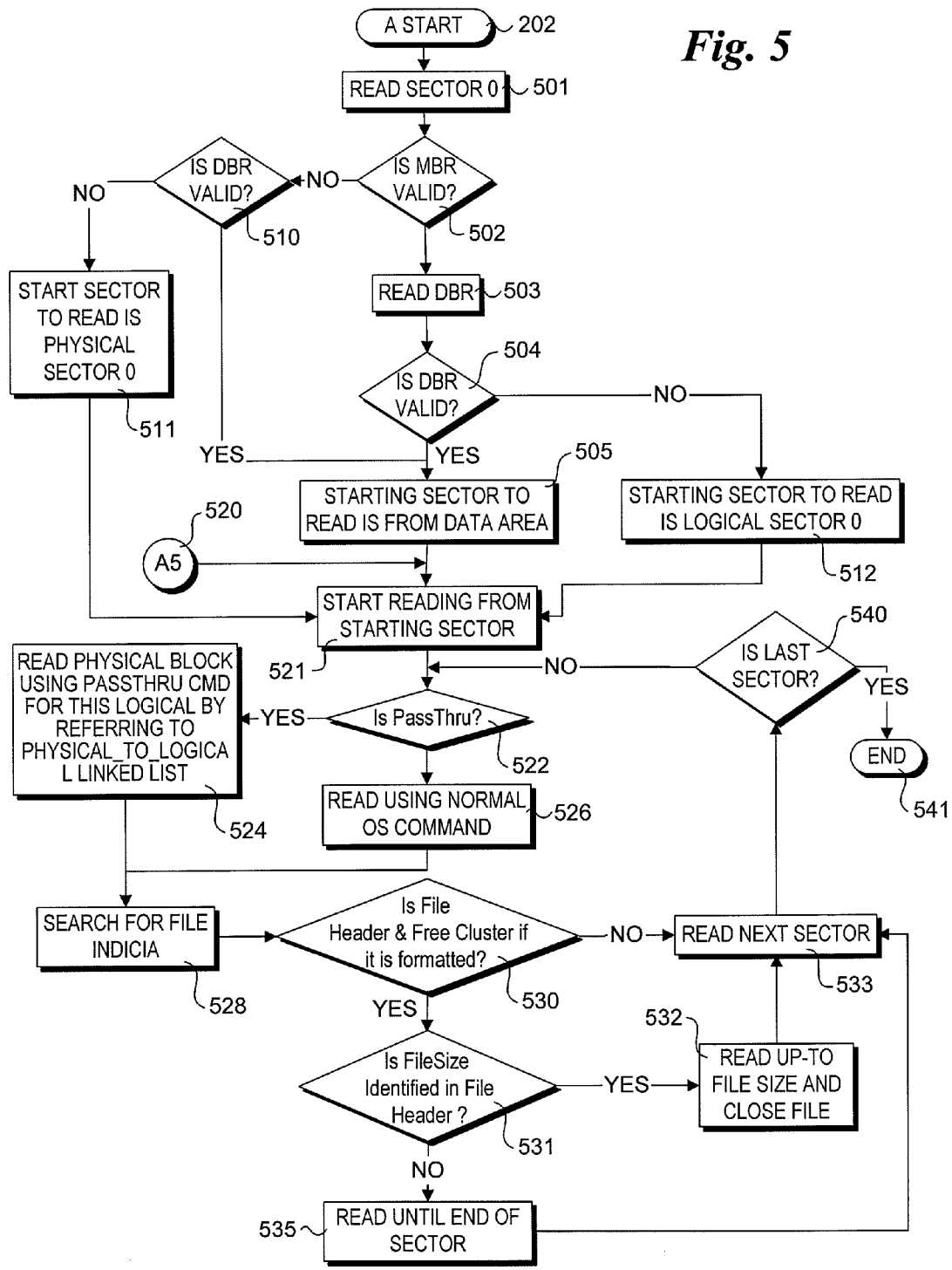

With continued reference to block 521, this is the point at which the operations of FIG. 5 are joined from blocks 520 in FIGS. 3*a* and 3*b*, i.e., wherein the starting sector is Logical Sector 0. Now all program processes are united at block 521, where the program starts reading from the starting sector, whichever sector has been determined (Physical Sector 0, Logical Sector 0, or Data Area). The following operations are then performed to extract (i.e., read) data pertaining to previously inaccessible files, such as picture files. For example, due to corrupted flash media, such files may not be accessible due to FAT errors, file header errors, checksum errors, etc.

In accordance with a decision block 522, if the Pass Thru flag is set (TRUE), the physical blocks are read using pass-through commands in a block 524 by employing the PHYSICAL_TO_LOGICAL linked list created above. If the PassThru flag is set (FALSE), the reading of logical blocks is performed using normal operating system commands, as depicted by a block 526.

As discussed above, the flash media is read to search for files corresponding to selected file types, which will typically comprise one or more picture format files, such as JPEG, GIF, MPEG, BMP, etc. More specifically, in a block 528 a search is made of indicia via which one or more selected file types can be identified, which will typically comprise a file header, but may comprise other types of indicia. Generally, the file-type indicia may be identified by searching for a specific string or pattern. The following operations illustrate the use of a file header for the file indicia. Those skilled in the art will recognize that similar operations may be performed to extract file data through use of other file indicia as well.

Generally, the reading is performed in sequential bases, using either a sequence of physical block reads (mapped to corresponding logical sectors), or direct reading of a sequence of logical sectors via the operating system. In response to encountering file indicia, a determination is made in a decision block 530 regarding whether the indicia corresponds to a file header, and whether a corresponding free cluster is formatted. If both are true, the logic proceeds to a decision block 531, wherein a determination is made regarding whether information identifying the file size (of the file) is included in the file header. If the file size is included in the header, the program continues to read data in accordance with a block 532 until data corresponding to the complete file has been read (as defined by the file size), whereupon the file is closed and the logic proceeds to a block 533 to read the next sector. (It is noted that a given file may span more than one sector.) In a corresponding decision block 540, a determination is made regarding whether the previous sector is the last sector to be processed. If it is, the process ends in accordance with an end block 541. If not, the program cycles back to block 530 to begin processing the next sector.

Returning to decision block 531, if the program finds a header but does not find the file size, it proceeds to a block 535, where it reads until the end of the current sector, and then returns to block 533. This process is repeated until the last sector is reached as determined by decision block 540, whereupon the program exits in accordance with end block 541.

Those skilled in the art will recognize that the foregoing process is merely exemplary, and that the recovery scheme may be modified in many ways. In some cases, for example, the high-level operations of the main program (FIG. 2) may have many more branches, for different media types, or for proprietary file systems, etc., as are disclosed above.

In another embodiment the file allocation table (FAT) on the media is examined to determine its validity, and if it is valid, an attempt to retrieve the file system starting sector, size, etc., is performed. This method is useful if the image data is stored in non-contiguous clusters. A cluster is a minimum allocation unit that the operating system assigns to store data, and typically comprises one or more sectors. For instance, if a cluster is equal to four sectors and each sector is 512 bytes, then even a file of size 1 byte will take up 2048 bytes of space on the medium.

Software Application UI for Performing the Recovery.

Figure 6A:
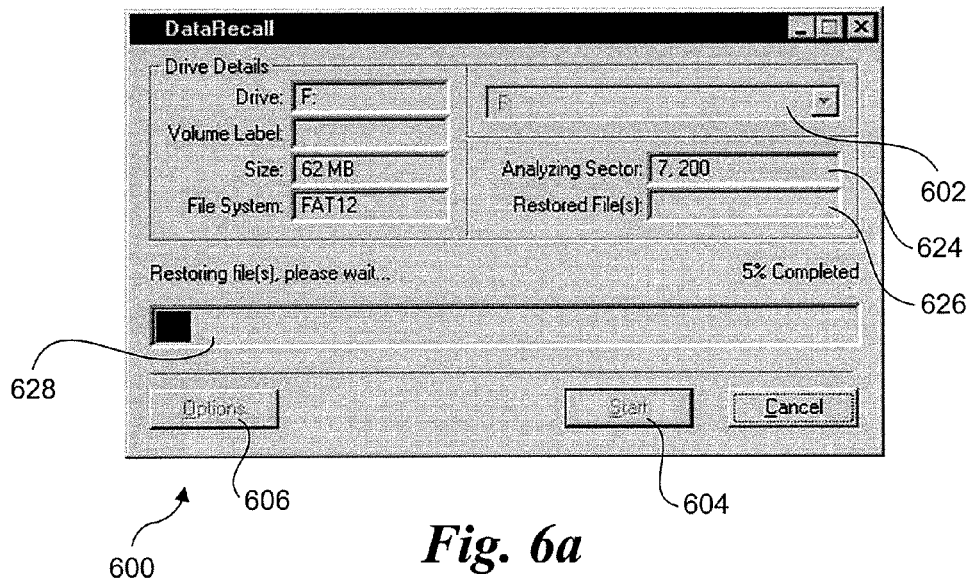
FIG. 6a is a representation of a drive selection dialog box presented to a user to enable the user to select a logical drive corresponding to a flash media device or reader.

In accordance with an aspect of the invention, the data recovery features are implemented via a software application (program) running on a computer. In general, the user will be presented with various user interface UI screens in response to corresponding user input events. For instance, the first step in a recovery process involves selecting the flash media device on which the recoverable data are stored. Selection of the device is enabled via a logical drive selection dialog box 600, as shown in FIG. 6a, which may be launched via a menu option or other UI element (not shown). Dialog box 600 includes a drive selection pulldown list 602 via which the user selects a logical drive corresponding to the flash media reader to recover the damaged data files from a flash media device read by the reader. As discussed above, the operating system, in combination with an appropriate driver, the reader, and the device-side file system interface make the flash device appear to an application running on the operating system as an accessible drive, similar to a system hard disk or CD-ROM.

Figure 6B:
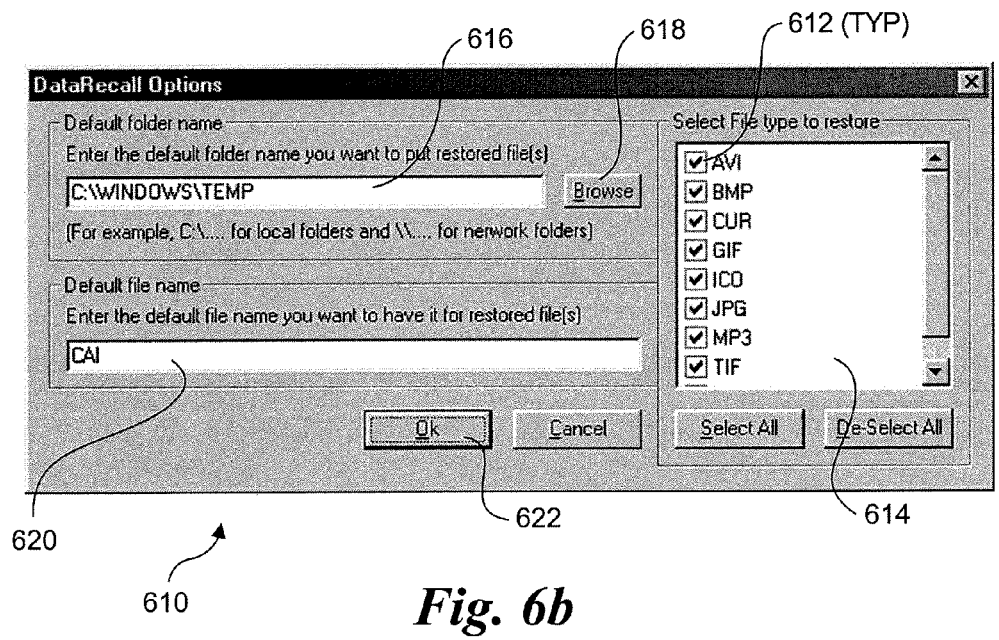
FIG. 6b is a representation of an options dialog box via which a user may enter/select various options pertaining to a file recovery operation.

After the logical drive is selected (generally), the user may either start the recovery process on that drive via activation of a "Start" button 604, or select an "Options" button 606 to specify more specific options related to the file recovery. Activation of "Options" button 606 will launch an options dialog box 610, as shown in FIG. 6b. The options dialog box enables the user to select various types of files to recover via selection of corresponding checkboxes 612 placed adjacent to the various file types' file extensions, as shown in a selection window 614. The user may also identify a default folder to put the recovered files in by entering a corresponding directory path in an edit box 616, or activating a "Browse" button 618, which will bring up another dialog (not shown) that enables the folder to be selected from among folders in the current file system. A default name for the recovered files may be entered in an edit box 620.

Upon selecting the desired options, the user will activate an "OK" button 622, which will return the user to drive selection dialog box 600. Upon activation of "Start" button 604, the software application will attempt to recover files from the damaged flash media using the methods described herein. During this process, the current sector being analyzed will be displayed in text box 624, and the most-recently recovered file(s) will be displayed in a text box 626, and the recovery progress will be represented by a status bar 628.

Figure 7A:
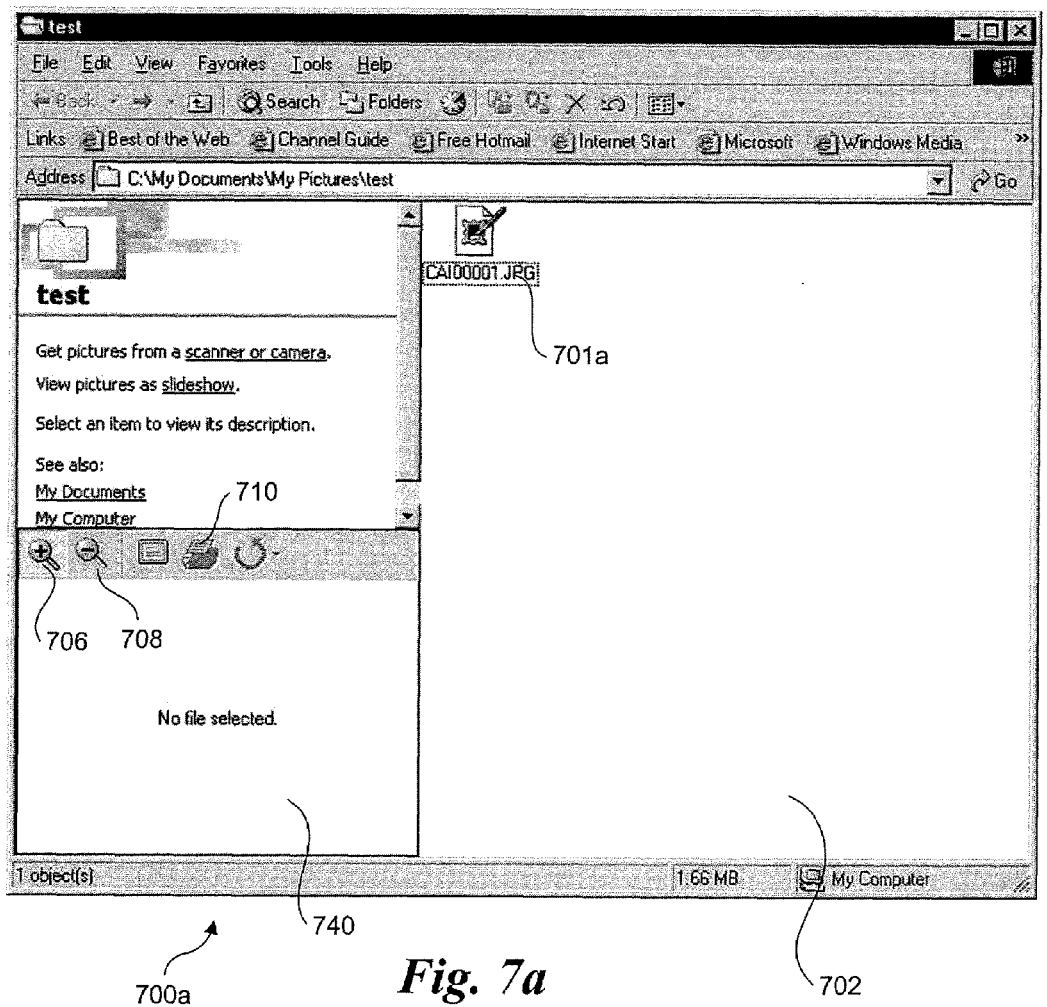
FIGS. 7a and 7b are representations of a viewing user interface via which a user may select recovered files to view, print, and rename.
Figure 7B:
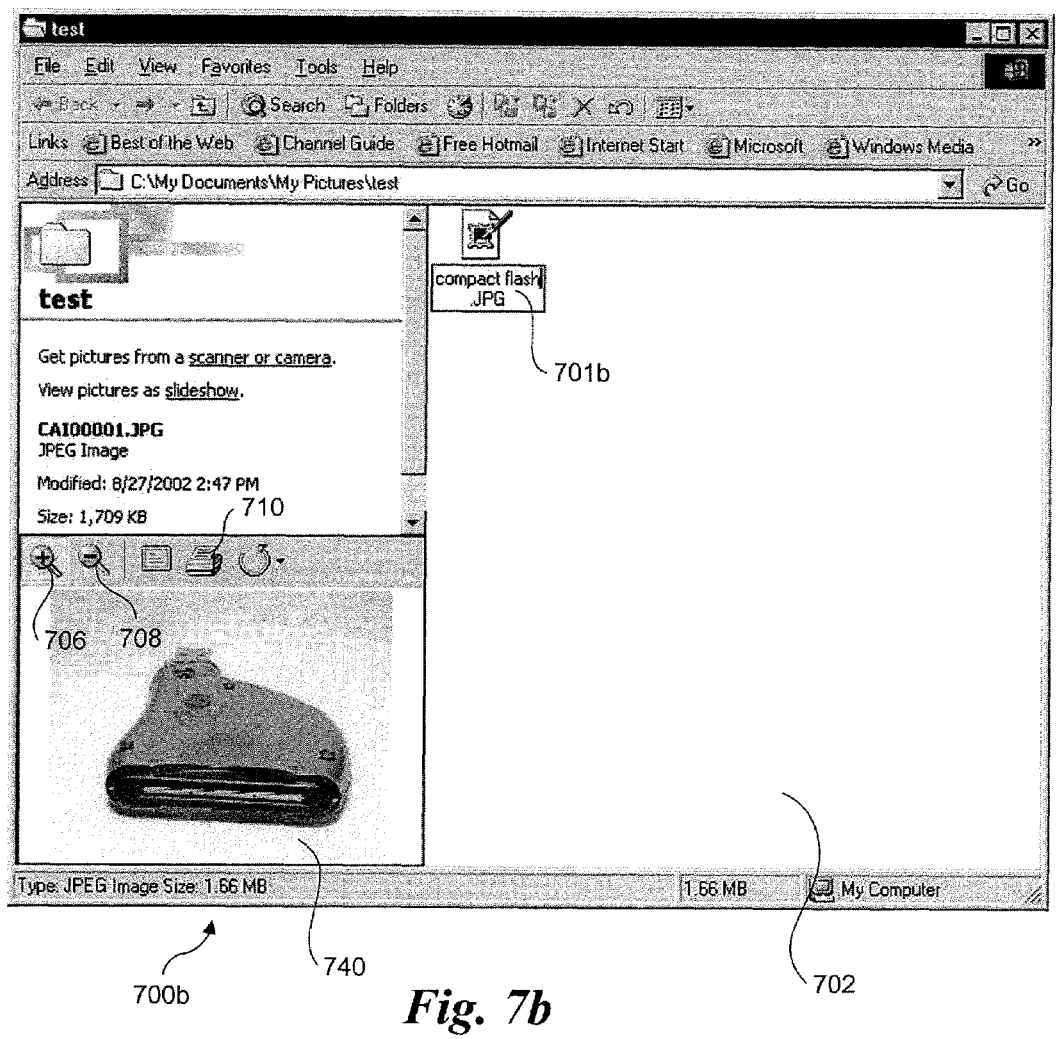

After the recovery process has been completed, the user is presented with a summary dialog (not shown). At this point, the user may select to view one or more recovered files via a viewing UI, such as UIs 700a and 700b shown in FIGS. 7a and 7b. In one embodiment, in the event multiple files are recovered, an appended number is added to the default file name, along with a corresponding file type extension. For example, in accordance with the illustrated "CAI" default file name, the recovered files might be CAI00001.JPG, CAI00002.JPG, CAI00001.GIF, etc. As shown in FIG. 7a, the list of recovered files with their original file-recovery names (in this case one JPG file 701a, named "CAI00001.JPG") are presented in a file selection window 702. In response to selection of a file, a corresponding image is displayed in an imaging window 704, as shown in FIG. 7b. The image can be zoomed in or out via respective controls 706 and 708. The image may also be printed via selection of a printer control 710. As further shown by JPG file 701b in FIG. 7b, the recovered file can be renamed by selecting the current name and editing it, as one would do in a conventional MICROSOFT WINDOWS UI.

Exemplary Computer System for Practicing the Invention

Figure 8:
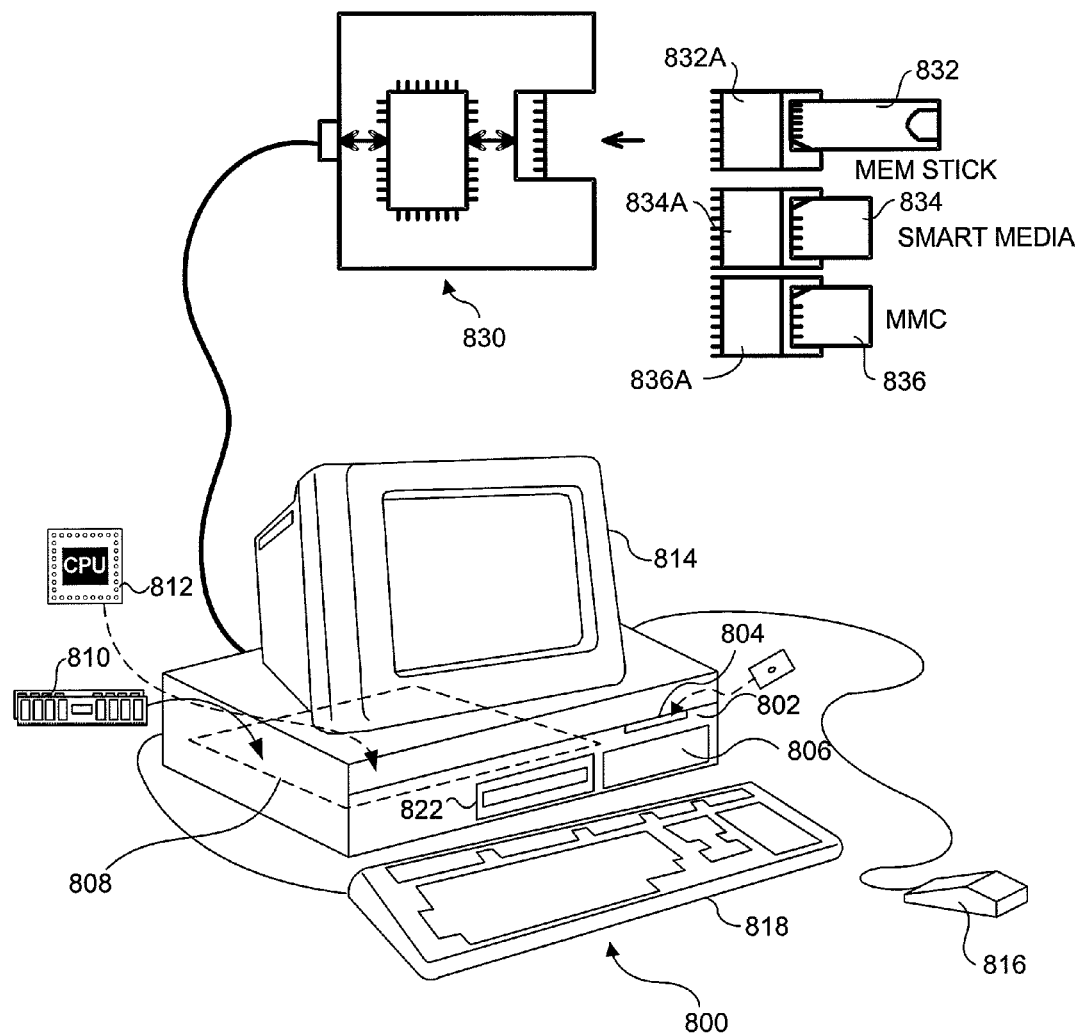
FIG. 8 is a schematic diagram of an exemplary computer system for executing a software program that is used to implement the embodiments of the invention disclosed herein.

With reference to FIG. 8, a generally conventional computer 800 is illustrated, which is suitable for use as client machines, application servers, and database servers in connection with practicing the present invention, and may be used for running client and server-side software comprising one or more software modules that implement the various operations of the invention discussed above. Examples of computers that may be suitable for client machines as discussed above include PC-class systems operating the WINDOWS NT or WINDOWS 2000 operating systems, Apple computers, Sun workstations operating the UNIX-based SOLARIS operating system, and various computer architectures that implement LINUX operating systems. Computer 800 is also intended to encompass various server architectures, as well as computers having multiple processors.

Computer 800 includes a processor chassis 802 in which are mounted a floppy disk drive 804, a hard drive 806, a motherboard 808 populated with appropriate integrated circuits including memory 810 and one or more processors (CPUs) 812, and a power supply (not shown), as are generally well known to those of ordinary skill in the art. It will be understood that hard drive 806 may comprise a single unit, or multiple hard drives, and may optionally reside outside of computer 800. A monitor 814 is included for displaying graphics and text generated by software programs and program modules that are run by the computer. A mouse 816 (or other pointing device) may be connected to a serial port (or to a bus port or USB port) on the rear of processor chassis 802, and signals from mouse 816 are conveyed to the motherboard to control a cursor on the display and to select text, menu options, and graphic components displayed on monitor 814 by software programs and modules executing on the computer. In addition, a keyboard 818 is coupled to the motherboard for user entry of text and commands that affect the running of software programs executing on the computer.

Computer 800 may also optionally include a compact disk-read only memory (CD-ROM) drive 822 into which a CD-ROM disk may be inserted so that executable files and data on the disk can be read for transfer into the memory and/or into storage on hard drive 806 of computer 800. Other mass memory storage devices such as an optical recorded medium or DVD drive may be included. The machine instructions comprising the software that causes the CPU to implement the functions of the present invention that have been discussed above will likely be distributed on floppy disks or CD-ROMs (or other memory media) and stored in the hard drive until loaded into random access memory (RAM) for execution by the CPU. Optionally, all or a portion of the machine instructions may be loaded via a computer network.

Generally, a flash media reader 830 will be employed to read the flash media. In one embodiment, flash media reader 830 comprises a Flashtoaster manufactured by OnSpec Electronic, Inc. as disclosed in U.S. Pat. No. 6,438,638. This reader provides universal support for reading a variety of different flash media types including MEMORY STICK devices 832, SMARTMEDIA devices 834, and MultiMediaCards (MMC)/Secure Digital Cards (SD) flash media 836 via respective adapters 832A, 834A, and 836A. Typically, flash media reader 830 may be connected to computer 800 via one of several well-known communication interfaces, such as a universal serial bus (USB) link.

As discussed above, embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium can include a read only memory (ROM); a random access memory (RAM); a magnetic disk storage media; an optical storage media; and a flash memory device, etc. In addition, a machine-readable medium can include propagated signals such as electrical, optical, acoustical or other form of propagated signals (e.g., carrier waves, infrared signals, digital signals, etc.).

In addition to the exemplary computer system discussed above, embodiments of the invention have been developed to work on other computing devices as well, including pocket PCs and personal digital assistants (PDAs) running various operating systems. Furthermore the general teachings and principles of the invention disclosed herein may be employed to implement data recovery schemes to recover data from most existing and future flash media devices.

Pass-through Interface

The pass-through interface provides a convenient means for interfacing with flash devices without the file system interfering with the call. To facilitate this, both the device driver and the firmware have to agree to a common protocol that will not occur during normal file system initiated Read/Writes.

This pass-through command interface consists of an 8 byte command packet. All flash products that use this protocol start with the PID Axxx. For example, OnSpec's CF Reader solution has a PID of A000. The command packet definition is as follows:

```
typedef struct
{
    BYTE bIDEErrCumFeatReg;     // 0, Err for read and
                                   Feature for write
    BYTE bIDESectCntReg;        // 1, Sector count
    BYTE bIDESectNumReg;        // 2, Sector number
    BYTE bIDECylLowReg;         // 3, Cylinder low
    BYTE bIDECylHighReg;        // 4, Cylinder high
    BYTE bIDEDrvHeadReg;        // 5, Drive/Head
    BYTE bIDEStatCumCmdReg;     // 6, Status for read and
                                      Command for write
    BYTE fDataFlags;            // 7, 0 for none, DATA_IN or
                                      DATA_OUT
} IDE_PASSTHRU_BLOCK;
typedef IDE_PASSTHRU_BLOCK *PIDE;
```

The fDataFlags have one of the values defined in the following structure:

```
typedef enum DATA_FLAGSx
{
    NO_DATA = 0,        // No data associated with the command
    DATA_IN,            // Data coming in from IDE device
    DATA_OUT,           // Data going out to the device
```

-continued

```
    STATUS_IN,                          // Ret just the Status and Error if any
    MSNENABLE_STATUS_IN,                // Status received after enabling MSN
    MSN_STATUS_IN,                      // Status received for GetMediaStatus
    IDENT_STATUS_IN,                    // Status recd. after a failed Ident cmd
    PASS_THRU_CMD_STATUS,               //Just return 8 bytes of status
    PASSTHRU_RESET_DEVICE,              // Device Reset, returns 8 bytes of status
    PASSTHRU_GET_DEV_CAPS = 0x80,       // First of new extensions
    PASSTHRU_SET_DEV_CAPS,              // Sets back capabilities
    PASSTHRU_ERASE_BLOCK,               // Erases a block in MS or SM
    PASSTHRU_GET_ADAPTER STATUS,        // Supported for 7-4-1
    PASSTHRU_READ_ID,                   // Reads device ID (4 Bytes)
    PASSTHRU_READ_RAW,                  // Does a raw read of nn bytes 0x85
    PASSTHRU_WRITE_RAW,                 // Does a raw write of nn bytes
    PASSTHRU_GET_MEDIA SN,              // Returns the media serial number
    PASSTHRU_LOCK_DEVICE,               // Locks a device for access by pass
                                        through
    PASSTHRU_UNLOCK_DEVICE,             // Unlocks a device for access by file
                                        system
    PASSTHU_RETURN_TABLE,               // Returns the Logical to Physical table
                                        0x8A:
    PASSTHRU_REDUNDANT_RD,              // Reads the redundant area of a block
    PASSTHRU_REDUNDANT_WR,              // Writes to the redundant area of a block
    PASSTHRU_BADBLOCK_TABLE,            // Reads the bad block address in one
                                        zone.
    PASSTHRU_GET_BADBLOCK_TABLE SIZE,   // Returns tablesize of bad blocks
    PASSTHRU_READ_EXTRA_DATA,           //Reads the Extra Data
    PASSTHRU_WRITE_EXTRA_DATA,          //Writes the Extra Data
    PASSTHRU_PUT_SERIALNUMBER,          //Writes the serialnumber into eeprom
    PASSTHRU_SD_CMD,                    // Support for direct SD commands
    PASSTHRU_WRITE_RAW_MS_FMT,          // MS Write Raw for format utility
    PASSTHRU_FLUSH_BUFFER               // For Stop Device in Windows 2000 OS
    PASSTHRU_FW_FLASH = 0xFF,           // f/w flash utility to fix qtsarena
} DATA_FLAGS;
typedef enum DIGIMEDIAx
{
    DM_SW_WRITEPROT             = 0x0001 // If set, allows software
                                           write protects
    DM_MULT_SECT                = 0x0002 // If set, device does
                                           multi sector read/writes
    DM_ALLOWS_ERASE             = 0x0004 // Media allows complete
                                           erase
    DM_ALLOWS_PART_ERASE        = 0x0008 // Allows partial Erase
                                           too
    DM_SN_SUPPORTED             = 0x0010 // If set, supports Serial
                                           Number
    DM_MEDIA_WRITEPROT          = 0x0020 // If set, Media is Write
                                         Protected
    DM_SKIP_ECC_CHECK           = 0x0040 // If set, Skip checking
                                           ECC in Read
    DM_SD_PT_SUPPORT            = 0x0080 // If set, SD PT calls are
                                           supported
    DM_DEVTYPE_CF               = 0x0100 // If set, the media is CF
    DM_DEVTYPE_SM               =0x0200// If set, the media is SM
                                           with format support
    DM_DEVTYPE_MS_NEW           =0x0400// If set, the media is MS
                                           with format support
    DM_DEVTYPE_MS               =0x0800// // If set, the media is
                                         MS. Don't use this bit anymore.
    DM_FLUSH_SUPPORTED          = 0x1000 // If set, supports Flush
                                           Commands
    DM_FW_FLASH_SUPPORTED       = 0x2000 // If set, supports PT
                                           Qtsarena fix
    DM_READ_ONLY_MODE           = 0x4000 // If set, SM set to read
                                           only mode
    DM_SM_CIS_1BIT_ERR            = 0x8000 // If set, SM CIS read
                                             with 1 bit error.
// The following bit definitions are for High word of
// Capabilities
    DMH_SUPPORTS_PASSWD         = 0x0001 // If set, supports
                                             Password feature
    DMH_SM_PASSWORD VERIFY      = 0x0002 // If set, Thumbstick
                                           password is not
                                           verified yet
    DMH_OK_CHIP                 = 0x0004 // If set, Device uses
                                             90C36LC1B Chip from OKI
    DMH_MMC_SD                  = 0x0008 // If set, Device is
                                           MMC/SD
```

-continued

```
DMH_SD_NO_MEDIA                  = 0x0010 // If set, Device is
                                   MMC/SD but has no media
                                   in the slot.
DMH_PCMCIA                       = 0x0020 // If set, it is PCMCIA
DMH_CF                           = 0x0040 // If set, it is CF
DMH_SUPPORTS_MULTIDEV_INSERTION  = 0x0080 // If set, it is
                                   7-4-1
} DIGIMEDIA
```

Pass-through Commands and Their Description

This section provides further details of exemplary pass-through commands. Flash products that use this protocol start with the PID Bxxx. For example OnSpec's CF+PCMCIA Reader solution has a PID of B006. In this case all commands are 31 bytes long. The Command block can be upto 16 bytes in length. The same set of commands as defined in this 16 byte block. The firmware recognizes a command to be a pass-through command if the Command number is 20Hex. C1, C0 denotes a 2 byte variable, C3 . . . C0 a 4 byte variable. All pass-through commands are returned with 13 bytes of status. Some commands may not have any data associated with them, in which case only the 13 bytes of status is returned. All commands are 10 bytes long and should be set in the CBW block to 10. Device selection should be done by specifying the LUN number for which the command is being sent.

PASSTHRU_GET_DEV_CAPS

Command syntax: 20 80 00 00 00 00 00 00 00 00

Returns 4 Bytes, Caps3 . . . Caps0 where Caps3 is the Most Significant Byte of a 32-bit Capabilities field and Caps0 is the Least Significant Byte. For example, in the case of SMART-MEDIA (PID 0XB00C), the value returned would be 0x000D. If there is No Media, Returns 2 Bytes data FF 04. Returns 13 bytes of CSW data, bCSWStatus is 00 always.

PASSTHRU_SET_DEV CAPS

Command syntax: 20 81 C3 C2 C1 C0 xx 00 00 00 where C3 stands for the MSByte of the 4 byte Capabilities structure, as defined in the DIGIMEDIA struct. For example, the host software may choose to turn ON (or off) MULTI_SECTOR Read/Write access. In such a situation, it would send the command as 20 81 00 00 00 02 01 00 00 00 to turn it off, the sequence sent would be 20 81 00 00 00 02 00 00 00 00. Likewise, to set Write protect, the command is 20 81 00 00 00 01 01 00 00 00. To clear Write protect, the command is 20 81 00 00 00 01 00 00 00 00. xx stands for action item and is to be intrepreted as follows:

01—Set Bit specified in the previous byte

00—Clear Bit specified in the previous byte

Note that only one feature can be set or cleared at a time. If Clear of MULTI_SECTOR and WRITE_PROTECT commands is desired, two separate commands need to be issued. Returns 13 bytes of CSW data, bCSWStatus is 00 if successful or 01 if un-successful.

PASSTHRU GET ADAPTER STATUS

Command syntax: 20 82 00 00 00 00 00 00 00 00

This command is supported only in the 7-4-1 device to notify how many and what media are inserted in the four slots at any point of time. Returns 2 bytes of AdapterStatus which defines the media inserted in the device as follows:

```
typedef enum 741MEDIAx
{
    AUTOF_NOMEDIA      = 0x0000 // No media in 7-4-1
    AUTOF_CF           = 0x0001 // Media is CF
    AUTOF_MMCSD        = 0x0002 // Media is MMC-or SD
    AUTOF_SMARTMEDIA   = 0x0004 // Media is SM
    AUTOF_MEMORYSTICK  = 0x0008 // Media is MS
} 741MEDIA;
```

The bit DMH SUPPORTS MULTIDEV INSERTION should be set in the device capabilities for the caller to issue this call. Returns 13 bytes of CSW data, bCSWStatus is 00 if successful or 01 if un-successful.

PASSTHRU_ERASE_BLOCK

Command syntax: 20 83 C3 C2 C1 C0 K0 00 00 00

C3 is the Most Significant Byte of the block address and C0 is the Least Significant Byte of the block.

In case of MEMORY STICK:

C1C0—Physical Address of the Block

C3C2—Logical Address of the Block

K0—BExx xxxx x—(6 bits are reserved)

B—if set it is Boot Block, if 0 it is User Block

E—if set Extra Data has to be written after Erase, if 0 just erase the block.

Returns 2 bytes data, 50 00, if successful, or Returns 2 bytes data, FF 04, if an error occurred. Returns 13 bytes of CSW data, bCSWStatus is 00 always.

PASSTHRU_READ_ID

Command syntax: 20 84 00 00 00 00 D1 D0 00 00

Returns D1D0 bytes where D1 is the most significant byte and D0 is the LSB. In the case of SMARTMEDIA, D1D0 would be 0004, with the first byte returning the Manufacturer code and the second byte the device ID. Returns 13 bytes of CSW data, bCSWStatus is 00 if success and 01 if unsuccessful.

PASSTHRU_READ_RAW

Command syntax: 20 85 C3 C2 C1 C0 D1 D0 00 00

Returns D1D0 bytes of data read from the address C3 . . . C0. Note that the caller must specify the exact address, which will be retrieved from the media. The firmware will NOT do any address translation whatsoever. In the case of SMARTMEDIA, the caller has to figure out the Zone address in addition to the block address and pass this in C3 . . . C0. Likewise, in the case of MC/SD media, the base address MUST be left shifted by 9 (i.e. Multiplied by 512) before sending down to the device. Returns 13 bytes of CSW data, bCSWStatus is 00 always.

PASSTHRU_WRITE_RAW
Command syntax: 20 86 C3 C2 C1I C0 KI K0 00 00

This command applies for SMARTMEDIA only.
C3C2C1—Phy.Address 4, . . . 2, Phy.Address1 is always 0
C0—DExx xxxx, where xx xxxx '6 bits' for SectorCount (1 . . . 20h)
D—if Set Block Write is CIS block
E—if set, block is already erased
K1K0—F1F0xx xxxx in that xx xxxx is a LBA Addresses from 0-0x3FF K1K0 is defined as follows:
F1 F0 Description
0 0 LBA address
0 1 Mark the Physical address Bad
1 0 Reserved (for future use)
1 1 Reserved (for future use)

Before issuing this command, ensure that this block is erased!
Returns 13 bytes of CSW data, bCSWStatus is 00 if successful or 01 if un-successful.
PASSTHRU_REDUNDANT_RD
Command syntax: 20 8B C3 C2 C1 C0 D1 D0 00 00

Returns D1D0 bytes (currently one block of data only is supported) of redundant data read from the address C3.C0. Note that the caller must specify the exact address, from which data will be retrieved from the media. The firmware will NOT do any address translation whatsoever. In the case of SMARTMEDIA, the caller has to figure out the Zone address in addition to the block address and pass this in C3.C0. Not applicable for of MMC/SD media. In the case of 8MB cards or less the number of pages per block is 16 so the amount of data returned would be 16*16 bytes for each page for a total of 256 bytes. For card capacities greater than 8 MB, the number of pages per block is 32 so the amount of data returned would be 32*16 bytes for a total of 512 bytes. Returns 2 bytes data FF 04 if an error occurred. Return 13 bytes of CSW data, bCSWtatus is 00 always.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A system comprising:
a computing device;
a flash storage media;
a flash adapter to interface the computing device with the flash storage media; and
a firmware to perform operations to recover data from the flash storage media comprising: accessing raw flash data stored on the flash storage media using a low-level access mechanism; searching the raw flash data for file indicia corresponding to a selected file type; reading data from the raw flash data based on information in the file indicia, said data comprising a recovered file; defining an application program interface (API) comprising a plurality of respective sets of pass-through commands, each respective set to enable the firmware to low-level access a particular media type of flash storage media corresponding to that set of pass-through commands; and building a physical-to-logical table with the firmware using the set of pass-through commands corresponding to the media type of the flash storage media.

2. The system of claim 1, wherein the flash adapter is a standalone device.

3. The system of claim 1, wherein the flash adapter is removable from the computing device.

4. The system of claim 1, wherein the flash adapter is integrated to the computing device.

5. The system of claim 1, wherein the computing device is a cellular telephone.

6. The system of claim 1, wherein the computing device is a personal digital assistant (PDA).

7. The system of claim 1, wherein the computing device is a digital camera.

8. The system of claim 1, wherein the computing device further comprises a Universal Serial Bus (USB) port.

9. The system of claim 1, wherein the flash storage media comprises a device compatible with memory sold under the trademark SMARTMEDIA.

10. The system of claim 1, wherein the flash storage media comprises a device compatible with memory sold under the trademark MEMORY STICK.

11. The system of claim 1, wherein the firmware resides at the flash storage media.

12. The system of claim 1, wherein the firmware resides at the computing device.

13. A system comprising:
a computing device;
a flash storage media;
a flash adapter to interface the computing device with the flash storage system media; and
a firmware to perform operations to recover data from the flash storage media comprising: determining a media type of the flash storage media; building a physical-to-logical table mapping physical storage locations to logical storage locations based on the media type of flash storage media; accessing raw flash data stored on the flash storage media using the physical-to-logical table; searching for a file header corresponding to a selected file type; reading data from the raw flash data based on information in the file header, said data comprising a recovered file; defining an application program interface (API) comprising a plurality of respective sets of pass-through commands, each respective set to enable the firmware to low-level access a particular media type of flash storage media corresponding to that set of pass-through commands; and building the physical-to-logical table with the firmware using the set of pass-through commands corresponding to the media type of the flash storage media.

14. The system of claim 13, wherein the flash adapter is a standalone device.

15. The system of claim 13, wherein the flash adapter is removable from the computing device.

16. The system of claim 13, wherein the flash adapter is integrated with the computing device.

17. The system of claim 13, wherein the computing device is a cellular telephone.

18. The system of claim 13, wherein the computing device is a personal digital assistant (PDA).

19. The system of claim 13, wherein the computing device further comprises a Universal Serial Bus (USB) port.

20. The system of claim 13, wherein the flash storage media comprises a device compatible with memory sold under the trademark SMARTMEDIA.

21. The system of claim 13, wherein the flash storage media comprises a device compatible with memory sold under the trademark MEMORY STICK.

22. A method for recovering data from a flash storage media comprising:
- determining the validity of a master boot record and a disk boot record;
- selecting one of a first physical sector, a first logical sector and a data area as a starting sector depending on the validity of the master boot record and the disk boot record;
- accessing raw flash data stored on the flash storage media using a low-level access mechanism; searching the raw flash data beginning with the start sector for file indicia corresponding to a selected file type; reading data from the raw flash data based on information in the file indicia, said data comprising a recovered file;
- defining an application program interface (API) comprising a plurality of respective sets of pass-through commands, each respective set enabling low-level access to a particular media type of flash storage media corresponding to that set of pass-through commands; and
- building a physical-to-logical table using the set of pass-through commands corresponding to the media type of the flash storage media.

23. A method for recovering data from a flash storage media comprising:
- determining a media type of the flash storage media;
- building a physical-to-logical table mapping physical storage locations to logical storage locations based on the media type of flash storage media;
- accessing raw flash data stored on the flash storage media using the physical-to-logical table;
- searching for a file header corresponding to a selected file type; and
- reading data from the raw flash data based on information in the file header, said data comprising a recovered file.

24. The method of claim 23 further comprising:
- defining an application program interface (API) comprising a plurality of respective sets of pass-through commands, each respective set enabling low-level access to a particular type of flash storage media corresponding to that set of pass-through commands; and
- building the physical-to-logical table using the set of pass-through commands corresponding to the media type of the flash storage media.

25. The method of claim 23, further comprising providing firmware to perform the determining, the building, the accessing, the searching, and the reading.

26. The method of claim 25, wherein the firmware resides at the flash storage media.

27. The method of claim 25, wherein the firmware resides at the computing device.

28. The method of claim 23, further comprising:
- providing a computing device to perform the determining, the building, the accessing, the searching, and the reading; and
- providing a flash adapter to interface the computing device with the flash storage media.

29. The method of claim 28, wherein the flash adapter is a standalone device.

30. The method of claim 28, wherein the flash adapter is removable from the computing device.

31. The method of claim 28, wherein the flash adapter is integrated with the computing device.

32. The method of claim 28, wherein the computing device is a cellular telephone.

33. The method of claim 28, wherein the computing device is a digital camera.

34. The method of claim 28, wherein the computing device is a personal digital assistant (PDA).

35. The method of claim 28, wherein the computing device is a digital camera.

36. The method of claim 28, wherein the computing device further comprises a Universal Serial Bus (USB) port.

37. The method of claim 28, wherein the flash storage media comprises a device compatible with memory sold under the trademark SMARTMEDIA.

38. The method of claim 28, wherein the flash storage media comprises a device compatible with memory sold under the trademark MEMORY STICK.

39. The method of claim 23, wherein the recovered file is an image.

* * * * *